United States Patent [19]

Shinji et al.

[11] Patent Number: 5,246,875
[45] Date of Patent: Sep. 21, 1993

[54] METHOD OF MAKING CHARGE COUPLED DEVICE IMAGE SENSOR

[75] Inventors: Uya Shinji; Dong K. Son, both of Kyungki, Rep. of Korea

[73] Assignee: Goldstar Electron Co., Ltd., Rep. of Korea

[21] Appl. No.: 961,476

[22] Filed: Oct. 15, 1992

[30] Foreign Application Priority Data

Oct. 15, 1991 [KR] Rep. of Korea ............. 18117/1991

[51] Int. Cl.$^5$ ............................. H01L 21/70
[52] U.S. Cl. ............................. 437/53; 437/2; 437/3
[58] Field of Search ............... 437/52, 53, 2, 3, 4, 437/5

[56] References Cited

U.S. PATENT DOCUMENTS

| | | | |
|---|---|---|---|
| 4,742,027 | 5/1988 | Blanchard et al. | 437/2 |
| 4,851,890 | 7/1989 | Miyatake | 437/53 |
| 4,906,584 | 3/1990 | Blouke et al. | 437/53 |
| 5,041,392 | 8/1991 | Kuroda et al. | 437/3 |
| 5,135,882 | 8/1992 | Karniewicz | 437/53 |

FOREIGN PATENT DOCUMENTS 216472 9/1986 Japan ..................... 437/53
16232 1/1991 Japan ..................... 437/53

Primary Examiner—Brian E. Hearn
Assistant Examiner—Kevin M. Picardat
Attorney, Agent, or Firm—Poms, Smith, Lande & Rose

[57] ABSTRACT

A method of making a charge coupled device image sensor comprising forming n+ type impurity regions for light receiving element and charge transfer element over a p type well of a n type substrate, forming an oxide film for insulating a gate over the substrate, forming a nitride film over the oxide film, the nitride film serving as an etch stopper, forming an insulating film such as a LTO film or BPSG film, forming a p+ type third impurity region in the p type well, forming an electrode over the third impurity region, and forming a PECVD LTO film. The PECVD LTO film and insulating film are removed by a wet etching method or a CDE method, so as to expose partially the nitride film. The wet etching is carried out under the condition that the nitride film is used as an etch stopper, thereby capable of solving the problem of a damage of substrate caused by a dry etching and thus avoiding generations of dark current and white defect. The thickness of the oxide film disposed beneath the nitride film can be easily adjusted to avoid a smear phenomenon.

10 Claims, 7 Drawing Sheets

METHOD OF MAKING CHARGE COUPLED DEVICE IMAGE SENSOR

BACKGROUND OF THE INVENTION

1. Field of the Invention

The present invention relates to a method of making a charge coupled device image sensor, and more particularly to a method of making a charge coupled device image sensor capable of a smear phenomenon.

2. Description of the Prior Art

Recently, solid state image sensors made by a semiconductor integrated circuit technique have been used as photoelectric conversion elements for image pickup devices converting images of objects into electric signals. Such sold state image sensors are generally classified into image sensors of the metal oxide semiconductor (MOS) type in which photo charge generated at a photodiode as a photoelectric conversion element is read out by a MOS transistor and image sensors of the charge coupled device (CCD) type in which photo charge generated at a photodiode is read out by a CCD shift resistor. Over the MOS type image sensors, the CCD type image sensors have an advantage of reduced noise, in that the photo charge generated at the photodiode is read out efficiently according to a clock signal.

Referring to FIG. 1, there is shown a sectional view illustrating of a structure of a general CCD image sensor. As shown in FIG. 1, the image sensor comprises a plurality of light receiving elements 11 each comprising a photodiode for generating photo charge in proportion to incident light and accumulating it, a plurality of vertical charge transfer elements 12 each comprising a CCD shift resistor for vertically transferring the photo charge accumulated in each corresponding light receiving element 11 according to a predetermined clock signal, a horizontal charge transfer element 13 comprising a CCD shift resistor for receiving signal charges from the vertical charge transfer elements 12 in a parallel manner and transferring them horizontally, and a sensing amplifier 14 for amplifying each signal charge transferred from the horizontal charge transfer element 13 and outputting it at an output terminal OUT.

FIG. 2 is a cross-sectional view taken along the line A—A' of FIG. 1, showing the sectional structures of each light receiving element 11 and each vertical charge transfer element 12 in the CCD image sensor.

As shown in FIG. 2, the structure of conventional CCD image sensor comprises a n type semiconductor substrate 21 and a p type well 22 formed over the semiconductor substrate 21. The well 22 has a first n+ type impurity region 23 forming a pn junction together with the well 22 to constitute a photodiode as the light receiving element 11, and a second n+ type impurity region 24 serving as a channel region of a vertical CCD shift resistor as the vertical charge transfer element 12. Over the well 22 is coated a gate oxide film 25 and a gate 26 as transfer electrodes of the vertical charge transfer element 12. A gate insulating film 27 is formed over the exposed surfaces of the gate oxide film 25 and gate 26. Over the gate insulating film 27, a photo shield layer 28 is formed which is made of a metal and adapted to allow light to enter only the n+ type impurity region 23 as the light receiving element.

In the conventional CCD image sensor with the above-mentioned structure, the first n+ type impurity region 23 together with the p type well 22 constitute the photodiode with the pn junction, which photodiode generates a photo charge in proportion to incident light and accumulates it. The accumulated photo charge is transferred to the second n+ type impurity region 24 according to a clock signal applied to the gate 26.

As mentioned above, the conventional CCD image sensor has the photo shield layer which functions to allow light to enter only the first n+ type impurity region 23 as the light receiving element and to prevent light from entering the second n+ type impurity region 24 as the charge transfer element. However, since a part of the incident light may enter inclinedly the first n+ type impurity region 23, it can reach the p type well 22 disposed around the second n+ type impurity region 24, thereby causing a noise charge e to generate at the p type well 22. This light is denoted by the reference numeral 29, in FIG. 2. The generated noise charge e is then transferred to the n+ type impurity region 24 and causes a smear phenomenon making the profile of a picture smear. As a result, there is a problem of a degradation in image quality, in the conventional CCD image sensor.

For avoiding such a smear phenomenon caused by the noise charge generated due to the leakage light, there has been a method wherein p+ type impurity regions surround the n+ type impurity regions 23 and 24 functioning as the photodiode and the channel region of vertical CCD shift resistor, respectively. In accordance with the method, the p+ impurity region surrounding the first n+ type impurity region 23 has a depth larger than that of the p+ impurity region surrounding the second n+ type impurity region 24 so that the generated noise charge is discharged out of the lowermost substrate 21, so as to avoid the smear phenomenon.

Another method for avoiding the smear phenomenon is a method for reducing the thickness of the gate insulating film 27 formed over the light receiving element.

Referring to FIGS. 3A to 3D, there is illustrated a method of making a CCD image sensor which has a gate insulating film with a reduced thickness for avoiding the smear phenomenon.

In accordance with this method, first, over a n type semiconductor substrate 31 is formed a p type well 32, as shown in FIG. 3A. In the p type well 32, n type impurity ions such as As or P are implanted to form n+ type impurity regions 33 and 34 serving as a photodiode and a channel region of a vertical shift resistor.

Thereafter, a gate oxide film 35 is formed over the resultant entire exposed surface. Over the gate oxide film 35 is deposited a polysilicon film which is, in turn, subjected to a patterning for forming a gate 36 between the impurity regions 33 and 34.

Over the resultant entire exposed surface, a low temperature oxide (LTO) film or a boro-phosphorous silicate glass (BPSG) film is then deposited to form a gate insulating film 37, as shown in FIG. 3B. Over the gate insulating film 37 is formed a photoresist 38 which is then partially removed at its portion disposed over the n+ type impurity region 33, so as to expose the corresponding portion of gate insulating film 37. Using the remaining portion of photoresist 38 as a mask, the exposed portion of gate insulating film 37 is partially removed by a dry etch method, so as to reduce its thickness. Subsequently, the remaining portion of photoresist 38 is removed.

Thereafter, a metal layer 39 made of, for example, aluminum is deposited over the resultant entire exposed surface, as shown in FIG. 3C. Over the metal layer 39 is coated a photoresist 40 which is, in turn, subjected to a photo etching so that its portion disposed over the n+ type impurity region 33 is removed for exposing the corresponding portion of metal layer 39.

Using the remaining portion of photoresist 40 as a mask, the exposed portion of metal layer 39 is etched, so as to form a photo shield layer for preventing light from entering regions except for the light receiving element, as shown in FIG. 3D. Finally, the remaining portion of photoresist 40 after the formation of photo shield layer is removed. Thus, a CCD image sensor is obtained.

In the CCD image sensor obtained by the above-mentioned method, the portion of gate insulating film 37 disposed over the light receiving element is partially etched to have a reduced thickness. Accordingly, light does not enter the n+ type impurity region 34, but enters only the n+ type impurity region 33 by virtue of the photo shield layer provided by the metal layer 39. As a result, it is possible to prevent the generation of noise charge and thus the smear phenomenon due to the noise charge.

FIGS. 4A and 4B are sectional views for explaining a smear effect depending on the thickness of gate insulating film over the light receiving element.

FIG. 4A is a sectional view of the CCD image sensor in which the insulating film 37 formed on the entire surface of the substrate 31 is partially etched so that its portion disposed over the n+ type impurity region 33 has a reduced thickness t1. On the other hand, FIG. 4B is a sectional view of a CCD image sensor in which the insulating film 37 is not subjected to an etching and thus has a uniform thickness t2 throughout the entire surface of substrate 31.

Where the thickness t2 of insulating film 37 over the n+ type impurity region 33 as the light receiving element is large, as shown in FIG. 4B, vertical incident light can not enter the n+ type impurity region 34 as the charge transfer element by virtue of the photo shield layer 39, but enter only the n+ type impurity region 33 and serves to generate a photo charge which is a signal charge.

Even though the photo shield layer 39 is provided, however, inclined incident light enters regions other than the n+ type impurity region 33. Among inclined incident lights, light L2 entering the p type well 32 disposed around the n+ type impurity region 34 generates a noise charge at a region near the n+ type impurity region 34. This noise charge is transferred to the n+ type impurity region 34, thereby causing a smear phenomenon.

In FIG. 4B, the reference character L3 denotes a leakage light which is reflected on the boundary surface defined between the insulating film 37 and the substrate 31. This light L3 causes a multi-reflection and thereby enters the p type well 32 disposed around the n+ type impurity region 34. As a result, a noise charge is generated in the same manner as mentioned above, thereby causing a smear phenomenon.

On the other hand, where the insulating film 37 has the reduced thickness t1 at its portion disposed over the n+ type impurity region 33 serving as the light receiving element, as shown in FIG. 4A, inclined incident light is prevented from entering the n+ type impurity region 33. As a result, it is possible to prevent the multi-reflection of light on the boundary surface defined between the insulating film 37 and the substrate 31 and thus restrain the generation of smear phenomenon.

However, although the CCD image sensor in which the insulating film 37 is partially etched to have a reduced thickness at its portions disposed over the light receiving element shields effectively the leakage light and thus avoids a smear phenomenon, it also has other problems that the thickness of insulating film 37 is difficult to be freely adjusted since the insulating film 37 is dry etched and that the surface of substrate may be damaged if the insulating film 37 is excessively etched.

The damaged substrate surface caused by the excessive etching of insulating film results in an increase in dark current and an increase in white defect, thereby degrading the image quality of image sensor.

SUMMARY OF THE INVENTION

Therefore, an object of the invention is to eliminate the above-mentioned problems encountered in the prior arts and to provide a method of making a CCD image sensor capable of avoiding a damage of the surface of a substrate by wet etching a portion of insulating film disposed over a light receiving element and avoiding the smear phenomenon.

In accordance with the present invention, this object can be accomplished by providing a method of making a charge coupled device image sensor comprising the steps of: preparing a semiconductor substrate of a first conductivity type; forming a well of a second conductivity type over the first conductivity type semiconductor substrate; implanting impurity ions of the first conductivity type in the well, to form a first impurity region of the first conductivity type serving as a light receiving element and a second impurity region of the first conductivity type serving as a charge transfer element, the second impurity region being spaced apart from the first impurity region at a predetermined distance; forming a gate oxide film over the entire surface of the substrate; depositing a polysilicon film over the gate oxide film and patterning it, to form a gate between the first and second impurity regions; forming a first insulating film over the resultant entire exposed surface after the formation of the gate; forming a second insulating film over the first insulating film and partially removing the second insulating film so that its portions disposed over the first and second impurity regions remain, the first insulating film being partially exposed through the removed portion of the second insulating film; implanting impurity ions of the second conductivity type in the well disposed beneath the exposed portion of the first insulating film, to form a third impurity region of the second conductivity type; forming a third insulating film over the resultant entire exposed surface after the formation of the third impurity region and removing a portion of the third insulating film disposed over the third impurity region, to expose the third impurity region; forming a metal electrode over the exposed third impurity region; forming a fourth insulating film over the resultant entire exposed surface after the formation of the metal electrode; removing the fourth insulating film disposed over the first impurity region and the third insulating film disposed over the second impurity region, in this order, to expose partially the second insulating film; removing the exposed portion of the second insulating film; depositing a metal layer over the resultant entire exposed surface after the partial removal of the second insulating film and removing a portion of the metal layer disposed over the first impurity region, to form a photo shield layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 5A to 5J, there is illustrated a method of making a CCD image sensor capable of avoiding the smear phenomenon in accordance with the present invention.

Figure 1:
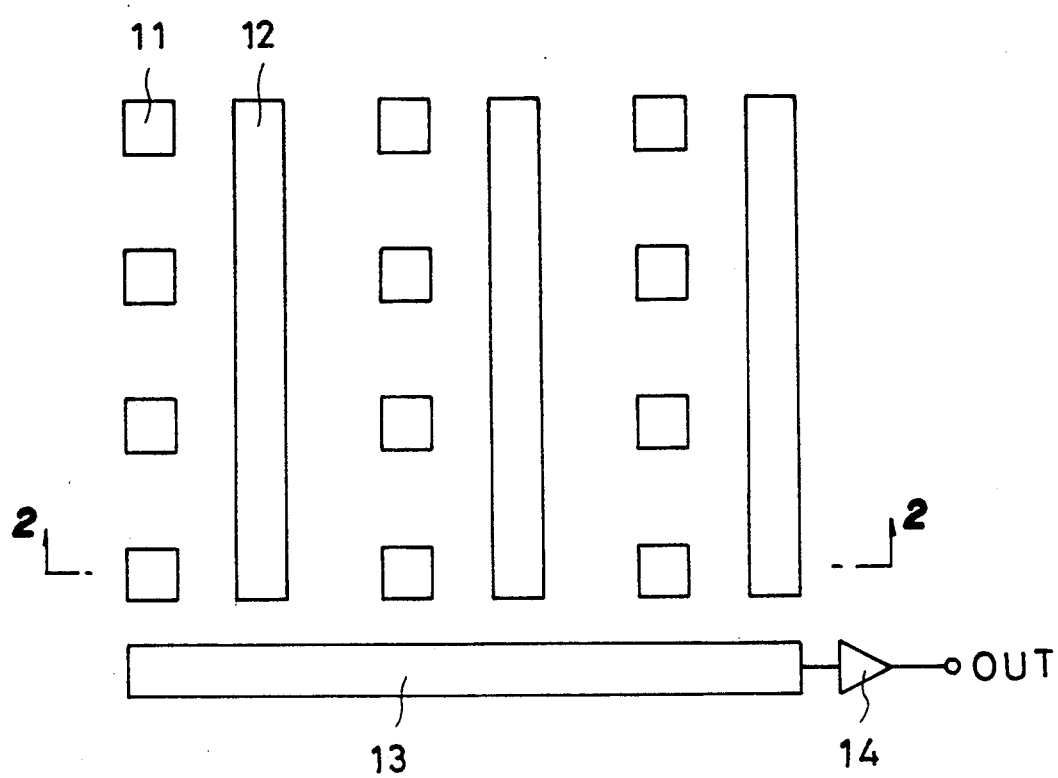
FIG. 1 is a sectional view illustrating of a structure of a general CCD image sensor.
Figure 2:
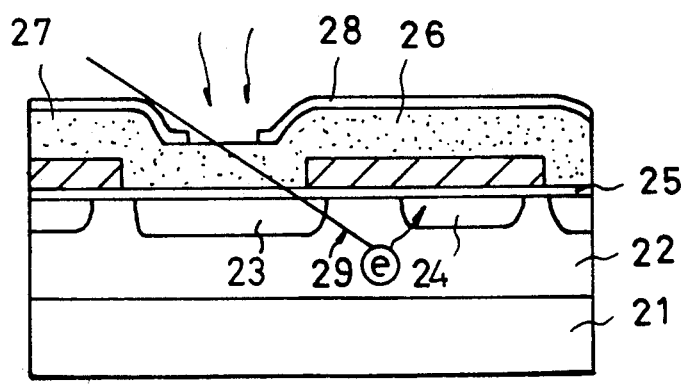
FIG. 2 is a cross-sectional view taken along the line A-A' of FIG. 1.
Figure 3A:
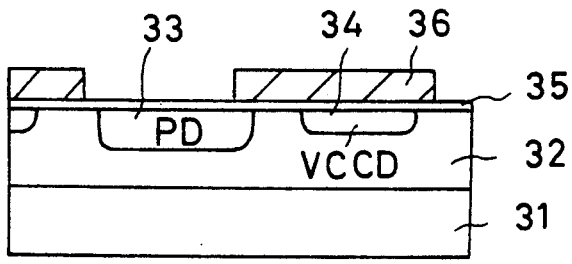
FIGS. 3A to 3D are sectional views illustrating a conventional method of making a CCD image sensor, for avoiding the smear phenomenon.
Figure 3B:
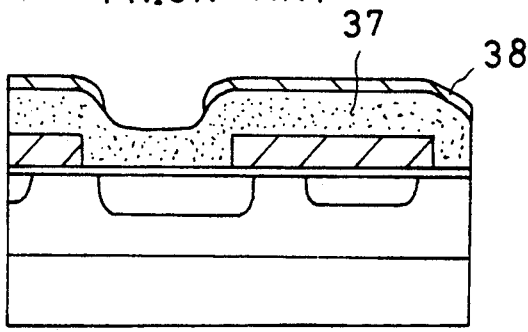
Figure 3C:
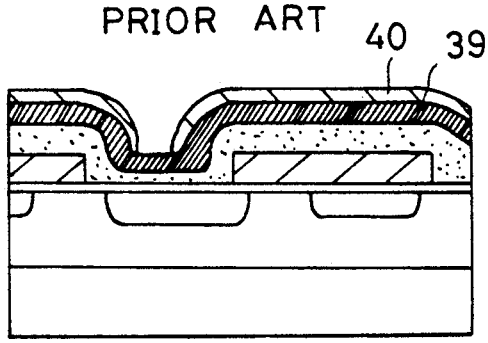
Figure 3D:
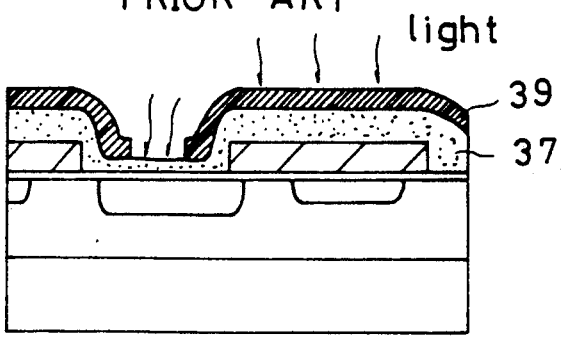
Figure 4A:
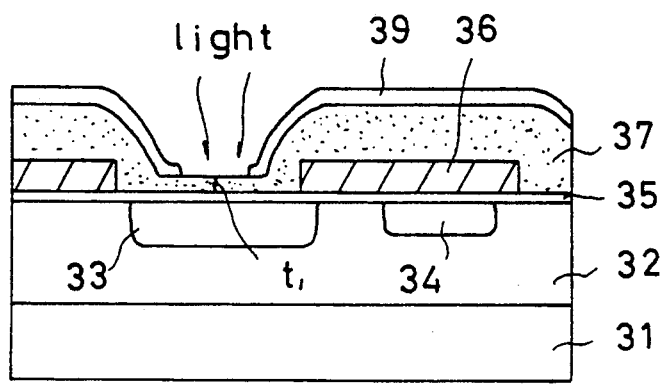
FIGS. 4A and 4B are sectional views for explaining a smear effect depending on the thickness of gate insulating film over a light receiving element.
Figure 4B:
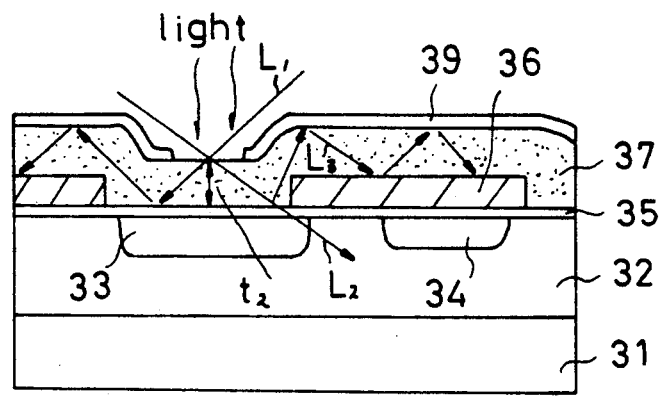
Figure 5A:
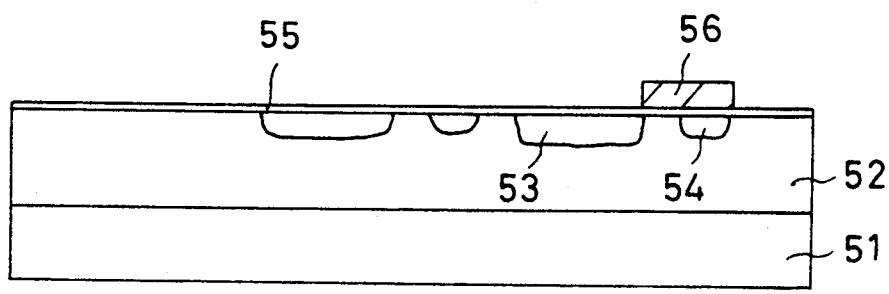
FIGS. 5A to 5J are sectional view illustrating a method of making a CCD image sensor capable of avoiding the smear phenomenon in accordance with the present invention.

In accordance with this method, first, over a n type semiconductor substrate 51 is formed a p type well 52, as shown in FIG. 5A. In the p type well 52, n type impurity ions such as As or P are implanted, so as to form a plurality of first n+ type impurity regions 53 and a plurality of second n+ type impurity regions 54 each corresponding to each first n+ type impurity region 53. For a simplicity of the description, the p type well 52 will be described hereinafter as having only one first n+ type impurity region 53 and one corresponding second n+ type impurity region 54.

Together with the p type well 52, the first n+ type impurity region 53 forms a pn junction, so as to constitute a photodiode. On the other hand, the second n+ type impurity region 54 forms a channel of a vertical CCD shift resistor serving as a vertical charge transfer element.

Thereafter, a gate oxide film 55 is formed over the resultant entire exposed surface, to have a thickness of about 200 Å. Over the gate oxide film 55 is deposited a polysilicon film which is, in turn, subjected to a patterning for forming a gate 36 between the first and second n+ impurity regions 53 and 54. The gate 36 serves as a charge transfer electrode.

Figure 5B:
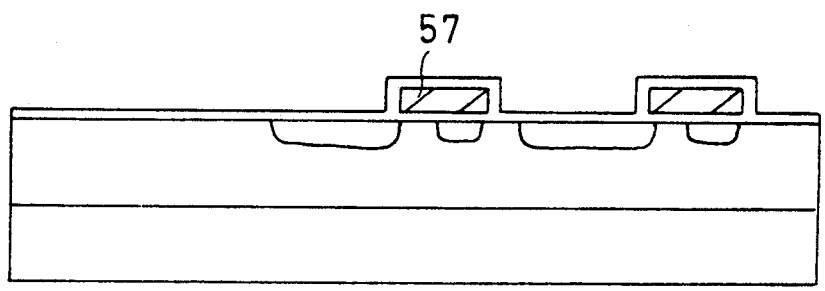
Figure 5C:
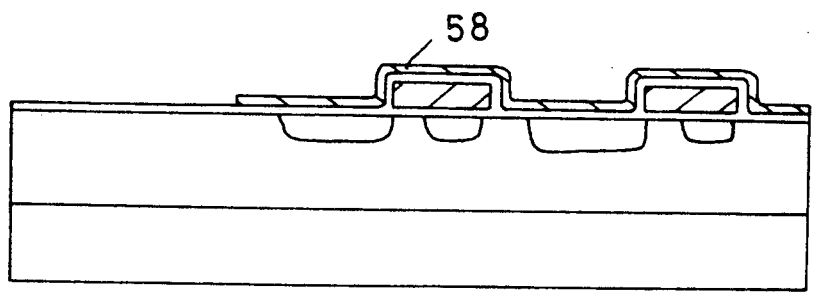

Over the resultant entire exposed surface, an oxide film 57 for gate insulation is formed to have a thickness of about 2,000 Å, as shown in FIG. 5B. The oxide film 57 serves to insulate the gate 56 and an electrode to be subsequently formed. The formation of oxide film 57 is achieved by oxidizing the polysilicon film for the gate 56 or depositing an additional low temperature oxide (LTO) film. In this case, the thickness of oxide film 57 can be optionally adjusted to be a thickness required for avoiding the smear phenomenon.

Over the gate insulating film 57 is formed a nitride film 58 which is an insulating film serving as an etching stopper. The nitride film 58 has a thickness of about 500 Å to about 1,500 Å. The nitride film is partially removed at its portion corresponding to a region at which electrode is formed, so as to expose the corresponding portion of oxide film 57. In place of the nitride film, a non-doped polysilicon film may be used as the insulating film for the etching stopper.

Figure 5D:
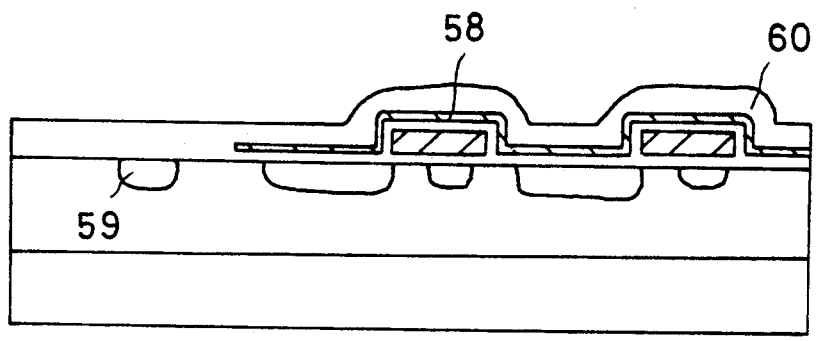

Thereafter, the p type well 52 disposed beneath the exposed portion of oxide film 57 is subjected to a well-known ion implantation process, so as to form a p+ type impurity region 59 for an electrode, as shown in FIG. 5D. Over the resultant entire exposed surface is formed an insulating film 60 such as a LTO film or a BPSG film.

Figure 5E:
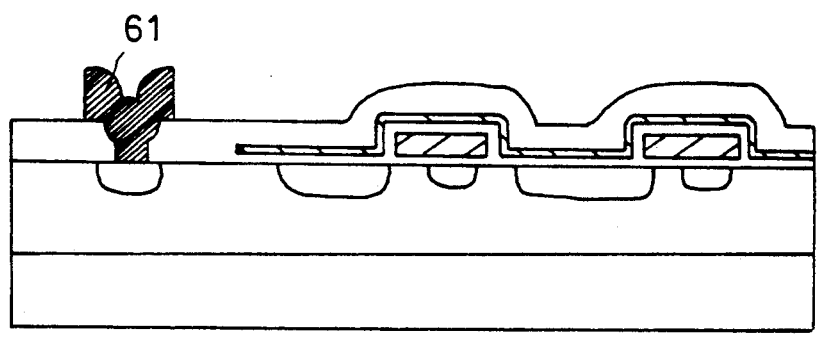

As shown in FIG. 5E, the insulating film 60 is then subjected to an etching so that its portion disposed over the p+ impurity region 59, that is, corresponding to the electrode forming region is removed for exposing the p+ impurity region 59. Over the resultant entire exposed surface is deposited a metal layer which is, in turn, subjected to a patterning, so as to form an electrode 61. The electrode 61 is in contact with the p+ type impurity region 59 at the removed portion of insulating film 60.

Figure 5F:
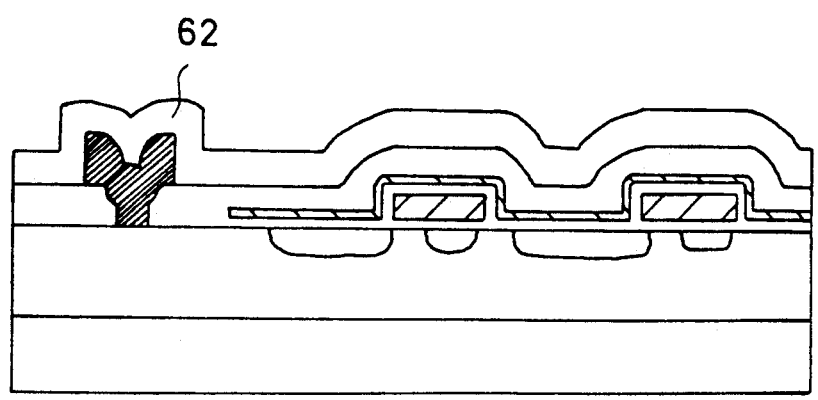

Over the resultant entire exposed surface is then formed an insulating film 62 for providing an insulation between the electrode 61 and a metallic photo shield layer to be subsequently formed, as shown in FIG. 5F. The formation of insulating film 62 is achieved by forming a LTO film having a thickness of about 2,000 Å using a plasma activated chemical vapor deposition (PECVD) method.

Figure 5G:
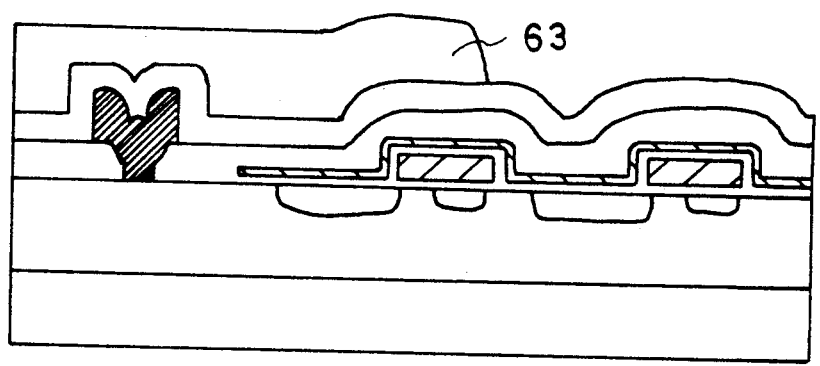

Thereafter, a photoresist 63 is coated over the resultant entire exposed surface and then subjected to a patterning so that its portions disposed over the first n+ type impurity region 53 and the second n+ type impurity region 54 are removed, as shown in FIG. 5G. As a result, the portion of insulating film 62 disposed over the first and second n+ type impurity regions 53 and 54 are exposed.

Figure 5H:
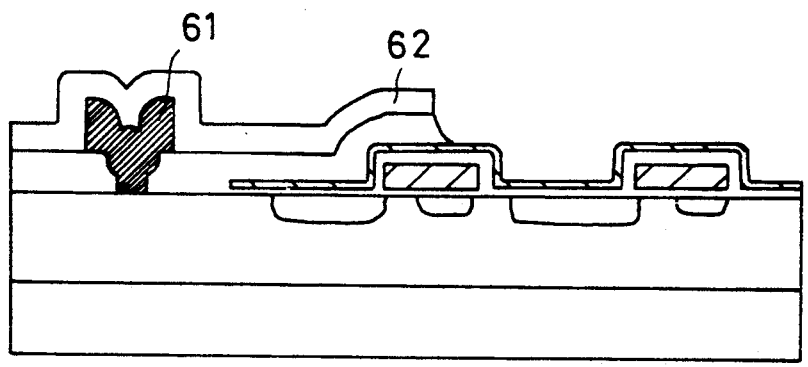

Using the remaining portion of photoresist 63 as a mask, the exposed portion of insulating film 62 and the portion of insulating film 60 disposed beneath the exposed portion of insulating film 62 are removed by a wet etching method, as shown in FIG. 5H. Subsequently, the remaining portion of photoresist 63 is removed. At this time, the insulating films 62 and 60 are etched until the nitride film 58 as the etch stopper is exposed.

For improving an etch efficiency upon etching the insulating films 62 and 60, impurity ions such as As or P are implanted in the insulating films 62 and 60, preceding the photoresist process shown in FIG. 5G, that is, following the formation of insulating film 63.

Figure 5I:
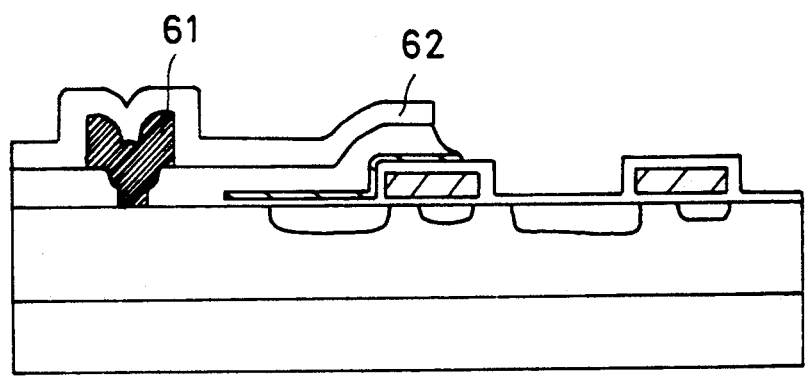

Thereafter, the exposed portion of nitride film 58 is etched using a wet etching method or a chemical dry etching (CDE) method, so as to be removed, as shown in FIG. 5I. As a result, only the insulating film 57 for gate insulation is disposed over the first n+ type impurity region 53 as the light receiving element and the second n+ type impurity region 54 as the charge transfer element.

Figure 5J:
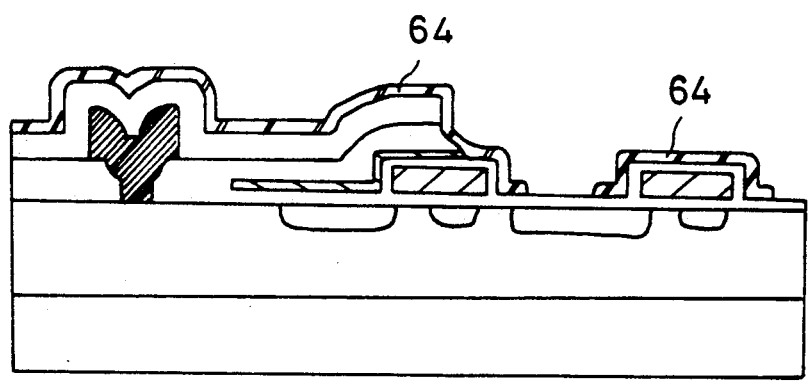

Over the resultant entire exposed surface, a layer of a metal such as aluminum is then deposited, as shown in FIG. 5J. The metal layer is removed at its portion disposed over the first n+ type impurity region 53, so as to form a photo shield layer 54. Thus, a CCD image sensor is obtained.

As apparent from the above description, the insulating films formed over the light receiving element are wet etched, in accordance with the method of the present invention. Accordingly, it is possible to solve the problem of a damage of substrate caused by the dry etching according to the prior arts and thus to avoid generations of dark current and white defect. Thus, there is an improvement in image quality, in CCD image sensors.

In accordance with the present invention, the wet etching is carried out under the condition that the lowermost insulating film is used as an etch stopper. Accordingly, the thickness of the oxide film disposed beneath the lowermost insulating film and over the light receiving element can be easily adjusted, in that the oxide film is not etched upon etching the insulating films. There is also an advantage of effectively preventing a smear phenomenon without any damage of substrate.

In conventional structures, there is a great difference in level between the light receiving element and the corresponding charge transfer element, because the oxide film formed over the entire surface of substrate is partially removed to reduce the thickness at its portion disposed over the light receiving element. In accordance with the present invention, however, the oxide film is formed to have a uniform thickness between the light receiving element and the corresponding charge transfer element, so as to reduce the difference in level between the elements. Such a reduction makes it possible to achieve easily a smoothness in a subsequent color filter formation process.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a charge coupled device image sensor comprising the steps of:

preparing a semiconductor substrate of a first conductivity type;

forming a well of a second conductivity type over the first conductivity type semiconductor substrate;

implanting impurity ions of the first conductivity type in the well, to form a first impurity region of the first conductivity type serving as a light receiving element and a second impurity region of the first conductivity type serving as a charge transfer element, the second impurity region being spaced apart from the first impurity region at a predetermined distance;

forming a gate oxide film over the entire surface of the substrate;

depositing a polysilicon film over the gate oxide film and patterning it, to form a gate between the first and second impurity regions;

forming a first insulating film over the resultant entire exposed surface after the formation of the gate;

forming a second insulating film over the first insulating film and partially removing the second insulating film so that its portions disposed over the first and second impurity regions remain, the first insulating film being partially exposed through the removed portion of the second insulating film;

implanting impurity ions of the second conductivity type in the well disposed beneath the exposed portion of the first insulating film, to form a third impurity region of the second conductivity type;

forming a third insulating film over the resultant entire exposed surface after the formation of the third impurity region and removing a portion of the third insulating film disposed over the third impurity region, to expose the third impurity region;

forming a metal electrode over the exposed third impurity region;

forming a fourth insulating film over the resultant entire exposed surface after the formation of the metal electrode;

removing the fourth insulating film disposed over the first impurity region and the third insulating film disposed over the second impurity region, in this order, to expose partially the second insulating film;

removing the exposed portion of the second insulating film;

depositing a metal layer over the resultant entire exposed surface after the partial removal of the second insulating film and removing a portion of the metal layer disposed over the first impurity region, to form a photo shield layer.

2. A method in accordance with claim 1, wherein the formation of the first insulating film is achieved by oxidizing the polysilicon film for the gate.

3. A method in accordance with claim 1, wherein the formation of the first insulating film is achieved by depositing an additional low temperature oxide film.

4. A method in accordance with claim 1, wherein the third insulating film comprises one of a low temperature oxide film and a boro-phosphorous silicate glass film.

5. A method in accordance with claim 1, wherein the third insulating film comprises a plasma activated chemical vapor deposition low temperature oxide film.

6. A method in accordance with claim 1, wherein the removal of the third and fourth insulating films is achieved by a wet etching method.

7. A method in accordance with claim 6, further comprising the step of implanting impurity ions in the fourth insulating film before the third and fourth insulating films are etched, for improving the etching efficiency.

8. A method in accordance with claim 6, wherein the second insulating film serves as an etch stopper upon etching the third and fourth insulating films.

9. A method in accordance with claim 8, wherein the second insulating film comprises a nitride film.

10. A method in accordance with claim 1, wherein the removal of the second insulating film is achieved by one of a wet etching method and a chemical dry etching method.

* * * * *